(12) United States Patent
Yang et al.

(10) Patent No.: US 6,797,565 B1
(45) Date of Patent: Sep. 28, 2004

(54) METHODS FOR FABRICATING AND PLANARIZING DUAL POLY SCALABLE SONOS FLASH MEMORY

(75) Inventors: Jean Yee-Mei Yang, Sunnyvale, CA (US); Yider Wu, Campbell, CA (US); Zhizheng Liu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 97 days.

(21) Appl. No.: 10/244,369

(22) Filed: Sep. 16, 2002

(51) Int. Cl.[7] ............................................. H01L 21/336
(52) U.S. Cl. ....................................... 438/261; 438/258
(58) Field of Search ................................ 438/258, 261

(56) References Cited

U.S. PATENT DOCUMENTS

| | | | |
|---|---|---|---|
| 6,117,730 A | 9/2000 | Komori et al. | |
| 6,218,227 B1 | 4/2001 | Park et al. | |
| 6,281,078 B1 | 8/2001 | Chang et al. | |
| 6,355,514 B1 | 3/2002 | Pham | |
| 6,362,051 B1 | 3/2002 | Yang et al. | |
| 6,509,232 B1 * | 1/2003 | Kim et al. | 438/264 |
| 6,566,194 B1 * | 5/2003 | Ramsbey et al. | 438/257 |
| 6,570,211 B1 * | 5/2003 | He et al. | 257/314 |
| 6,580,103 B2 * | 6/2003 | Yi et al. | 257/202 |
| 6,630,384 B1 * | 10/2003 | Sun et al. | 438/266 |

* cited by examiner

*Primary Examiner*—David Nelms
*Assistant Examiner*—Thao P. Le
(74) *Attorney, Agent, or Firm*—Eschweiler & Associates, LLC

(57) ABSTRACT

Methods are disclosed for fabricating dual bit SONOS flash memory cells, comprising forming polysilicon gate structures over an ONO layer, and doping source/drain regions of the substrate using the gate structures as an implant mask. Methods are also disclosed in which dielectric material is formed over and between the gate structures, and the wafer is planarized using an STI CMP process to remove dielectric material over the polysilicon gate structures.

22 Claims, 9 Drawing Sheets

METHODS FOR FABRICATING AND PLANARIZING DUAL POLY SCALABLE SONOS FLASH MEMORY

FIELD OF INVENTION

The present invention relates generally to semiconductor device processing and more particularly to methods for fabricating flash memory cells in a semiconductor device.

BACKGROUND OF THE INVENTION

Flash and other types of electronic memory devices are constructed of memory cells operative to individually store and provide access to binary information or data. The memory cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual cells are organized into individually addressable units or groups such as bytes or words, which are accessed for read, program, or erase operations through address decoding circuitry using wordlines and bitlines. Conventional flash memories are constructed in a cell structure wherein one or more bits of information or data are stored in each flash memory cell. In typical single bit memory architectures, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well.

The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer. Such single bit memory architectures can be partitioned into multiple bits by programming partially. However, such electrical partition methods reduce the performance of the devices in terms of program, erase, and access speeds, as well as reliability.

Other types of memory devices include ones comprising silicon or polysilicon above and below the ONO layer, which are sometimes referred to as SONOS memory devices. Such devices may include physical dual bit memory cells, individually adapted to store two binary bits of data by localized charge trapping. The SONOS memory devices provide data retention with thin bottom oxide, low-voltage operation, and fast programming speed.

Dual bit memory cells are generally symmetrical, including two identical and interchangeable source/drain regions. Application of appropriate voltages to the gate, drain, and source terminals allows access to one of the two bits (e.g., for read, program, erase, verify, or other operations). Core cells in flash memory devices, whether single bit or multiple-bit, may be interconnected in a variety of different configurations. For instance, cells may be configured in a virtual ground type configuration, with the control gates of the cells in a row individually connected to a wordline. In addition, the source/drain regions of memory cells in a particular column are connected together by a conductive bitline. In operation, individual flash cells and the individual data bits thereof, are addressed via the respective bitlines connected to first and second source/drain regions thereof and a wordline connected to the gate using peripheral decoder and control circuitry for programming (writing), reading, erasing, or other functions.

As device densities increase and product dimensions decrease, it is desirable to reduce the size of individual memory cells, sometimes referred to as scaling. However, the fabrication techniques used to produce conventional dual-bit SONOS flash memory cells limit or inhibit the designer's ability to reduce cell dimensions. In the preferred manufacturing processes, an ONO layer is formed on a substrate, over which a patterned resist is formed. An initial implantation is performed using the resist as a mask for selective introduction of dopant impurities into portions of the substrate next to prospective source/drain regions thereof. The initial implant typically provides a relatively low dosage of dopants at a relatively high energy. The resist is then removed and a thermal process is used to drive the dopants deeper into the substrate.

Thereafter, a second patterned resist mask is formed to expose the source/drain regions, followed by a second implantation at higher dosage and lower energy. After the implantations, the second resist is removed, and gate structures are formed over prospective channel regions of the cells, for example, using polysilicon. In order to scale the memory cell devices to facilitate increased device densities, it is desirable to narrow the length of the cell channel regions, and hence the length of the gate structures. However, process limitations in alignment of the first and second resist masks effectively limit the ability to scale the channel lengths of the memory cells while controlling the operating parameters of the device within desired performance specifications. Angled implants, such as halo or pocket implants, can be done with the source/drain implants in one mask, but this results in undesirably sharp dopant junctions because there is no thermal diffusion allowed between the two implants. Thus, there is a need for improved manufacturing techniques by which dual bit SONOS flash memory devices may be scaled without sacrificing device performance.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later.

The invention provides methods for fabricating dual bit SONOS and other flash memory cells, involving formation of polysilicon gate structures over an ONO layer, and doping of source/drain regions of the substrate using the gate structures as an implant mask. The invention also provides memory fabrication methods in which dielectric material is formed over and between the gate structures, and the wafer is planarized using an STI-like planarization process, such as chemical mechanical polishing. The invention thus facilitates the manufacture of scaled memory devices using existing processing steps, such as STI CMP operations, which may be performed at multiple points in an overall process flow, thereby reducing the complexity of process development and optimization. In addition, the invention provides for self-alignment of the implanted source/drain regions, thereby avoiding or mitigating misalignment problems experienced in conventional methods and facilitating scaling of memory cell dimensions.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
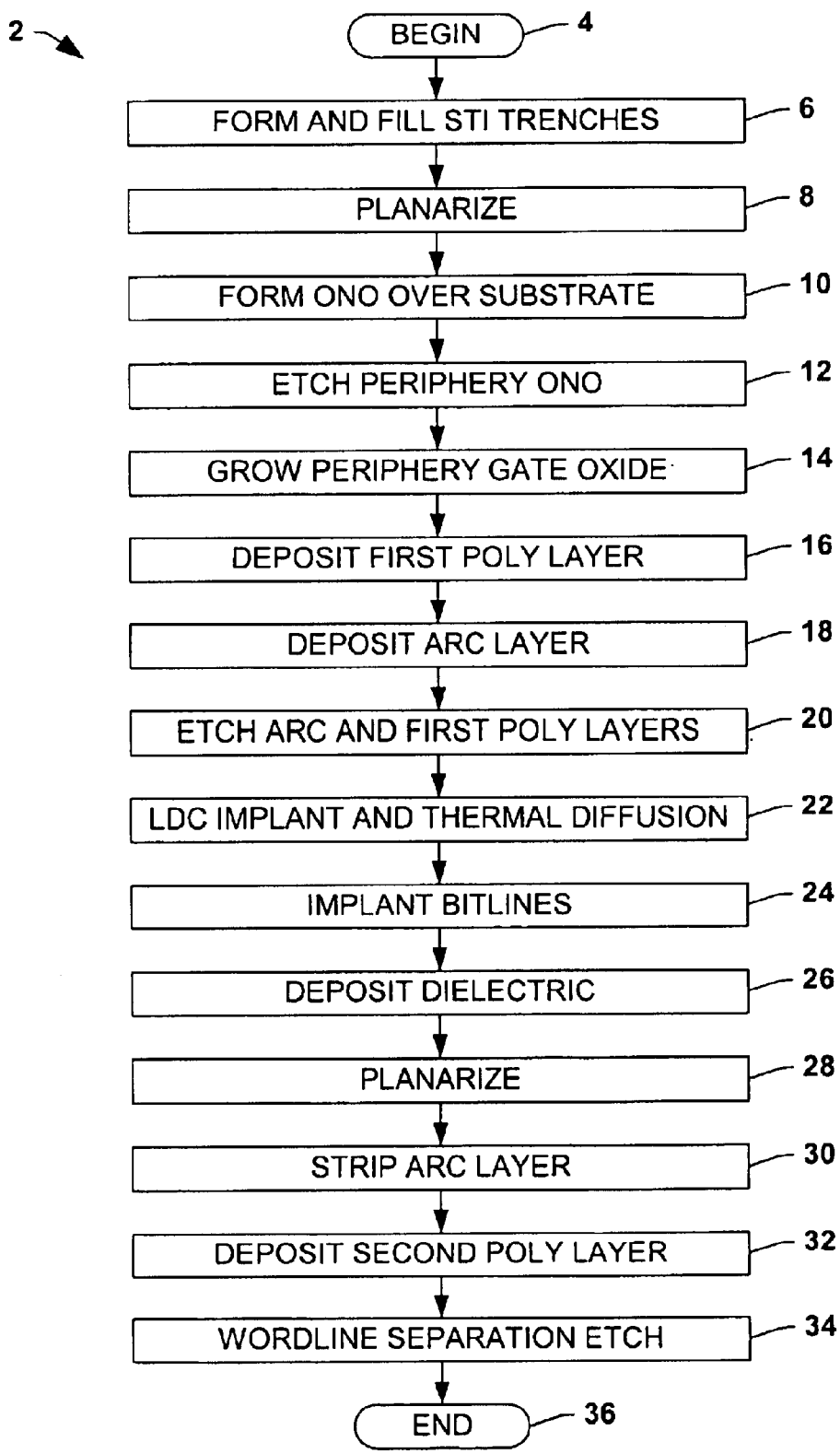
FIG. 1 is a flow diagram illustrating an exemplary method of fabricating flash memory devices in accordance with the present invention.

One or more implementations of the present invention will now be described with reference to the drawings, wherein like reference numerals are used to refer to like elements throughout, and wherein the various structures are not necessarily drawn to scale. The present invention relates to techniques and methods for fabricating flash memory devices, such as dual bit SONOS type flash memory cells illustrated and described below. However, it will be appreciated that the invention may be employed in fabricating other types of flash memory devices, such as single-bit cells, or others, and that the invention is not limited to the implementations specifically illustrated and described herein.

Referring initially to FIG. 1, an exemplary method 2 is illustrated for fabricating flash memory cells in a wafer in accordance with one or more aspects of the present invention. Although the method 2 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. In one example, the method 2 or variants thereof, may be used in manufacturing dual bit memory devices, as illustrated and described below with respect to FIGS. 3–17.

Beginning at 4 of FIG. 1, shallow trench isolation (STI) trenches are formed and filled at 6, and the wafer is planarized at 8 using a chemical mechanical polishing (CMP) process. The trenches are formed at 6 by etching portions of the wafer substrate in isolation regions thereof using nitride material to mask active regions. Isolating material, such as $SiO_2$, is then deposited over the wafer, filling the trenches and covering the nitride etch mask. At 8, a CMP process is employed to remove a portion of the deposited isolating material, exposing the nitride mask and separating the isolation structures in the isolation regions. Thereafter, the nitride mask material is removed from the wafer active regions, for example, using a wet etching operation.

At 10, an ONO layer is formed over the substrate comprising a first oxide layer overlying the substrate, a nitride layer overlying the first oxide layer, and a second oxide layer overlying the nitride layer. Any appropriate process steps and materials may be employed in forming the ONO layer at 10, including oxidation and/or deposition techniques as are known. The layer formed at 10 can be any other dielectric-charge trapping-dielectric triple layer stack, including but not limited to an ONO stack. In the case of oxide dielectrics, any of the oxide layers can include nitride or other dopants for optimal device and reliability performance. In addition, the nitride layer can be rich in Si, N, and/or dopants such as oxygen to facilitate enhanced device performance and reliability performance. Portions of the ONO layer may then be selectively removed from peripheral regions of the wafer at 12 using an etch process, and a gate oxide is formed in the periphery at 14.

At 16–20, polysilicon (POLY) gate structures are formed over prospective channel regions of the substrate. At 16, a first polysilicon layer is deposited over the ONO layer, such as using chemical vapor deposition (CVD) processes as are known. An anti-reflective coating (ARC) layer, for example, $SiN_3$, $SiON$, $SiN_x$, $SiC_x$, or $SiON_x$ is deposited at 18 over the first polysilicon layer. Portions of the first polysilicon layer and the anti-reflective coating layer are then removed in the source/drain regions at 20 using an etch process. At 22, a first implant process is performed, followed by a thermal diffusion operation. The first implant at 22 comprises implanting the prospective source/drain regions of the wafer with first dopants to a first depth after forming the polysilicon gate structures, using the gate structures as an implant mask. Thereafter, the substrate is heated to drive the first dopants into the substrate to a second depth and to laterally diffuse a portion of the first dopants under the polysilicon gate structures. The first implant and the subsequent thermal diffusion at 22 thus provide laterally diffused channel (LDC) doping.

At 24, a second implant is performed to provide second dopants to the source/drain regions of the substrate to a third depth (e.g., less than the second depth), again using the polysilicon gate structures as an implant mask. Thus, unlike the conventional patterned implants described above, the method 2 advantageously provides self-aligned implants at 22 and 24, and allows for thermal diffusion between the implants for junction profile control. This, in turn, facilitates further scaling of the memory cell dimensions in SONOS and other types of flash memory devices by avoiding or mitigating misalignment between the first and second (e.g., LDC and bitline) implants at 22 and 24, respectively. Thereafter at 26 and 28, insulative dielectric material is deposited over the wafer to fill the spaces between the polysilicon gate structures, before the gates of cells along common wordlines are connected at 32 and 34.

At 26, dielectric material, such as $SiO_2$ is deposited using any known deposition process (e.g., CVD), which covers the upper surfaces of the polysilicon gate structures and the doped substrate in the source/drain regions. At 28, the STI CMP process from step 8 is repeated to planarize the wafer. The process at 28 removes dielectric material deposited at 26, stopping on the anti-reflective coating (typically nitride) layer at the upper surfaces of the poly gate structures. It is noted that since the STI process at 6 and 8 also involves reduction of $SiO_2$ material which stops on a nitride layer, the CMP processes at 8 and 28 can be the same or similar. In this manner, the number and complexity of process steps to implement the method 2 is reduced. At 30, the remaining nitride ARC layer material is removed, such as using known nitride stripping techniques, leaving the upper portions of the polysilicon gate structures exposed over the channel regions (e.g., with dielectric material therebetween).

Thereafter at 32, a second polysilicon layer is deposited, for example, using the same or similar material and processes as those employed in forming of the first polysilicon layer at 16 above. The second polysilicon material connects all the polysilicon gate structures following the deposition thereof at 32. At 34, portions of the first and second polysilicon layers between cells associated with different logical words are removed to electrically disconnect gates structures destined for connection to different wordlines. This leaves the gates of memory cells in a common word connected to one another by the remaining portions of the second polysilicon layer. The remaining portions of the second polysilicon layer thus operate as wordlines to connect to the gates of word groupings of memory cells. The exemplary method 2 ends at 36, after which further process steps (not shown) may be performed to fabricate peripheral devices in the periphery of the wafer, followed by metalization and other back end processing. Alternatively, some or all of the peripheral device processing may be carried out in parallel with processing of the core memory cells in accordance with the exemplary method 2 and other methods of the invention.

Figure 2A:
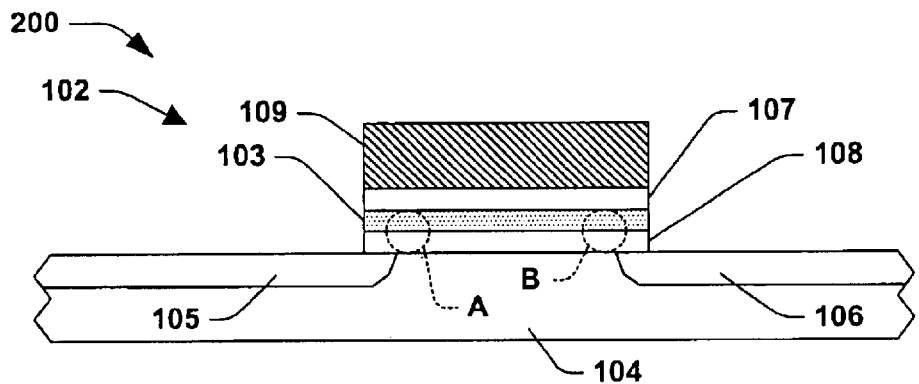
FIG. 2A is a partial side elevation view in section illustrating an exemplary dual bit flash memory cell which may be fabricated in accordance with one or more aspects of the invention.
Figure 2B:
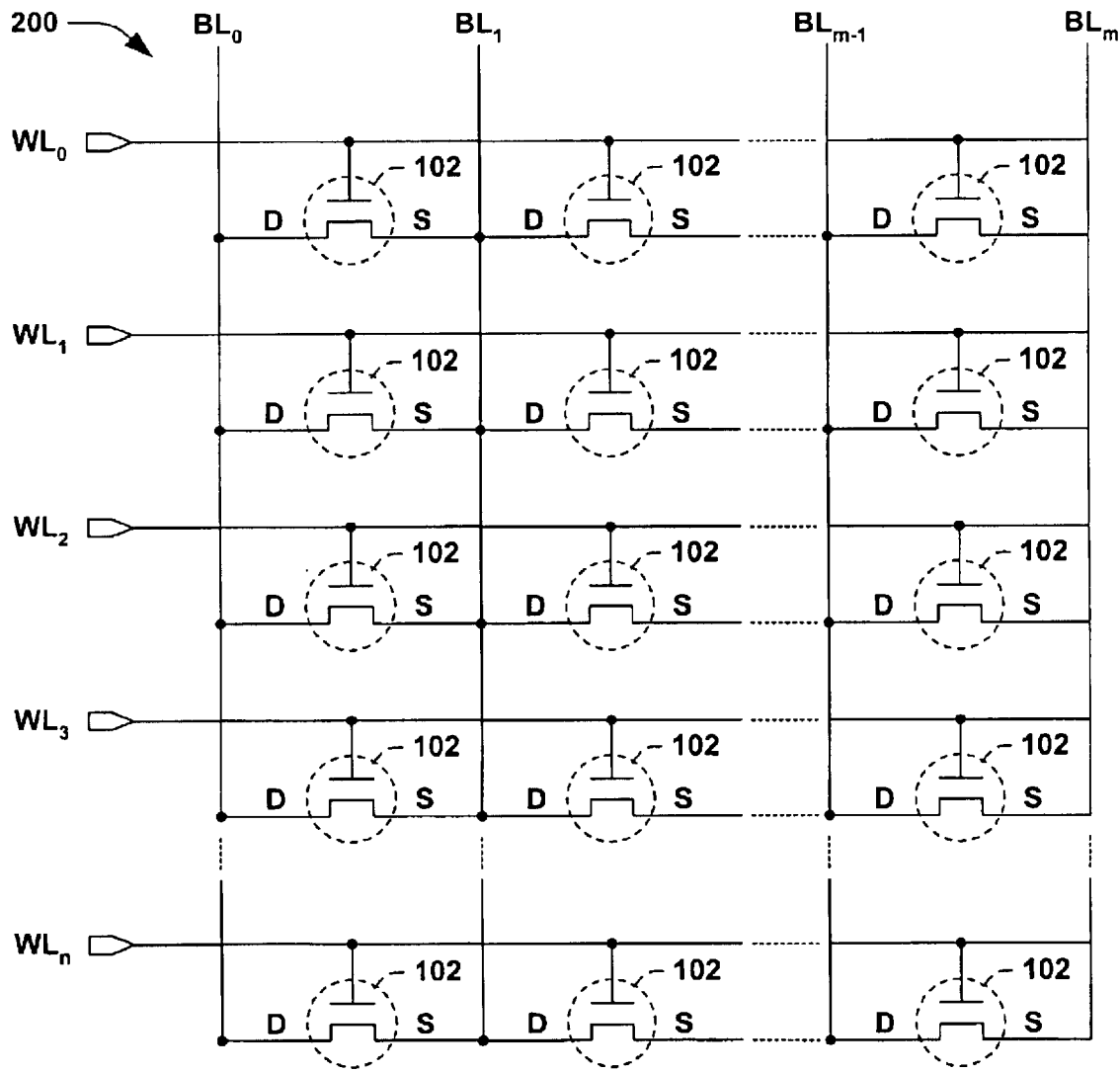
FIG. 2B is a schematic diagram illustrating a portion of an exemplary flash EPROM memory array comprising a plurality of dual bit flash memory cells organized for access using wordlines and bitlines.

FIGS. 2A and 2B illustrate an exemplary dual bit memory cell 102 and a portion of a memory array 200 including one or more interconnected cells 102 in one exemplary simplified form, which may be fabricated in accordance with the various methods of the invention. Thereafter, FIGS. 3–17 illustrate fabrication of memory cells in accordance with the invention. The memory cell 102 of FIG. 2A comprises a P-type substrate 104 with an N+ source 105 and an N+ drain 106. The cell 102 further comprises an ONO layer comprising a silicon nitride layer 103 located between upper and lower $SiO_2$ layers 107 and 108, respectively. A polysilicon gate 109 overlies the upper oxide layer 107, and is doped with an N-type impurity (e.g., phosphorus). The memory cell 102 is operable to store and provide access to two data bits, a left bit represented by the dashed circle A and a right bit represented by the dashed circle B. The dual bit memory cell 102 is generally symmetrical, wherein the drain 106 and the source 105 are interchangeable. For example, the left junction 105 may serve as the source terminal and the right junction 106 as the drain terminal with respect to the right bit B. Likewise, the right junction 106 may serve as the source terminal and the left junction 105 as the drain terminal for the left bit A.

An exemplary array 200 of cells 102 is illustrated in FIG. 2B, comprising rows of flash cells 102 with gate terminals coupled to an associated word line (e.g., $WL_0$ thru $WL_n$), and columns cells 102, with a drain of one cell 102 coupled to an associated bit line (e.g., $BL_0$ thru $BL_m$) and the source of an adjacent cell. It is noted in FIG. 2B that each row of flash cells 102 associated with a word line is connected in series, with the source of one cell 102 coupled to the drain of an adjacent cell 102, wherein each drain terminal of the cells 102 within a single column is connected to the same bit line, sometimes referred to as a virtual ground memory architecture. An individual flash cell 102 may thus be selected via application of appropriate voltages to an associated word line and a pair of bit lines bounding the cell 102 of interest. Although the exemplary array 200 of FIG. 2B is illustrated in the present example, it should be understood that one or more aspects of the present invention are also applicable to other array architectures.

Figure 3A:
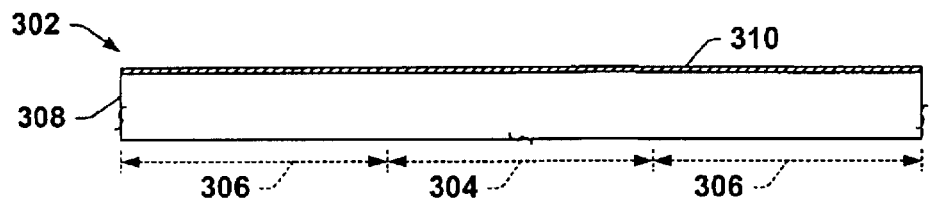
FIGS. 3A–3F are partial side elevation views in section illustrating isolation processing of a semiconductor wafer to form shallow trench isolation structures in a substrate.
Figure 3B:
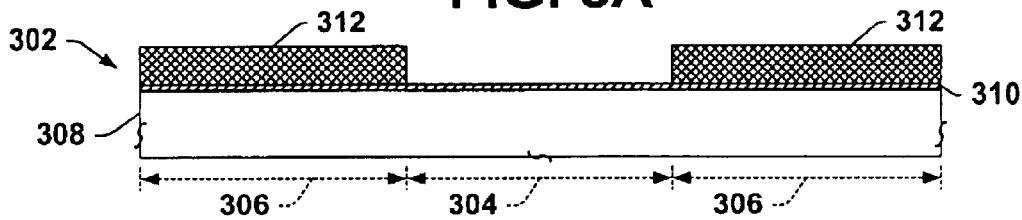

In FIGS. 3–17, fabrication of dual cell SONOS type memory cells in a semiconductor wafer 302 is illustrated in accordance with one or more aspects of the invention, beginning with formation of isolation structures in isolation regions 304 to separate active regions 306 of a substrate 308. In FIG. 3A, a nitride layer 310, such as $SiN_3$, SiON, $SiN_x$, $SiON_x$, or the like, is formed over the substrate 308, and a patterned resist mask 312 is formed in FIG. 3B, covering portions of the nitride layer 310 in the active regions 306 and leaving portions of the nitride 310 exposed in the isolation region 304.

Figure 3C:
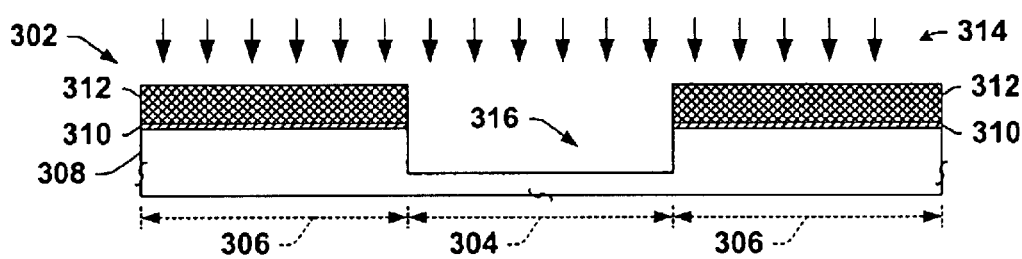
Figure 3D:
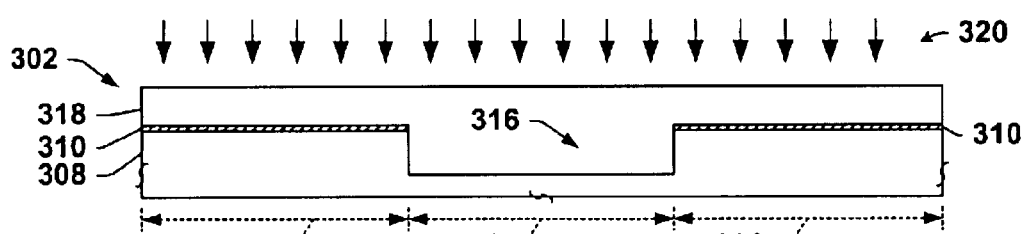
Figure 3E:
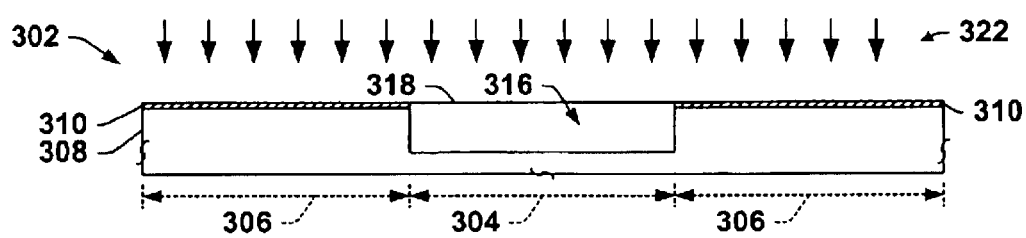
Figure 3F:
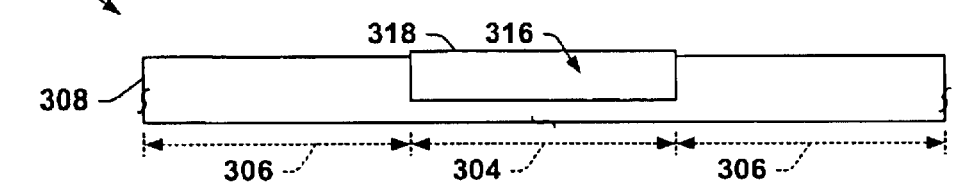

In FIG. 3C, an etch process 314 is employed to form a trench cavity 316 through the nitride 310 and into the substrate 308 for isolating the active regions 306 from one another, and the resist 312 is removed. In FIG. 3D, a dielectric material 318, such as $SiO_2$, is deposited using a deposition process 320. An STI CMP process 322 is then employed in FIG. 3E to planarize the wafer 302, removing dielectric material 318 and stopping on the nitride 310, thereby separating the dielectric material 318 in the trench 316 from other such isolation structures in the wafer 302. The remaining nitride material 310 is then removed by a stripping process (not shown), by which the wafer 302 appears as in FIG. 3F.

Figure 4:
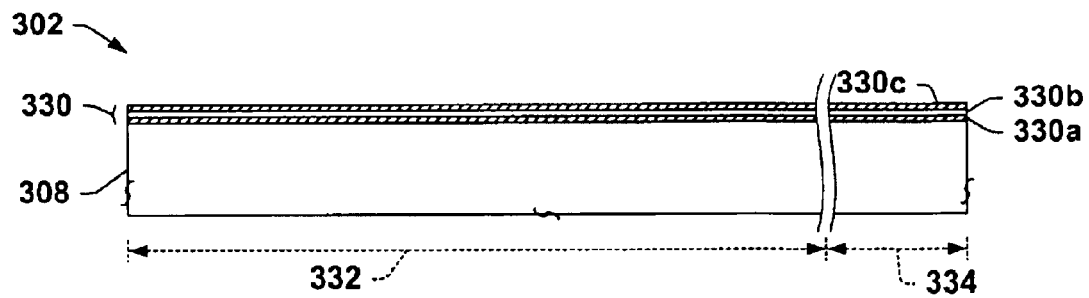
FIG. 4 is a partial side elevation view in section illustrating formation of an ONO layer over the substrate in the wafer of FIGS. 3A–3F.
Figure 5:
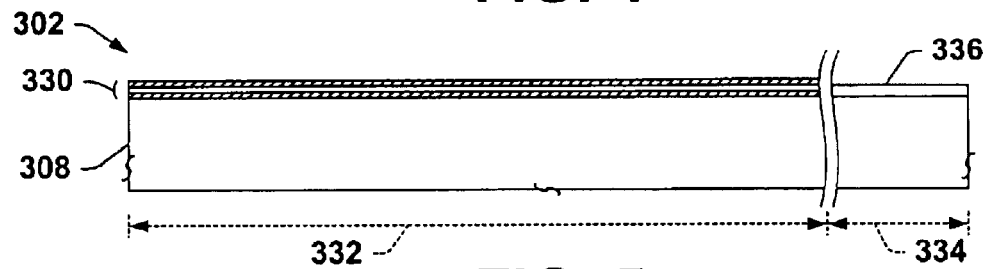
FIG. 5 is a partial side elevation view in section illustrating formation of a peripheral gate oxide over a peripheral region in the wafer of FIG. 4.
Figure 6:
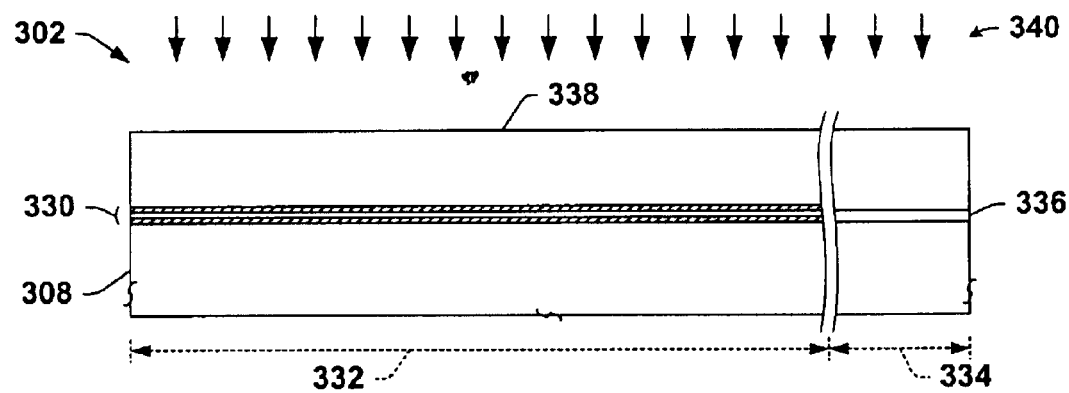
FIG. 6 is a partial side elevation view in section illustrating deposition of a first polysilicon layer over the ONO layer and the peripheral gate oxide layer in the wafer of FIG. 5.
Figure 7:
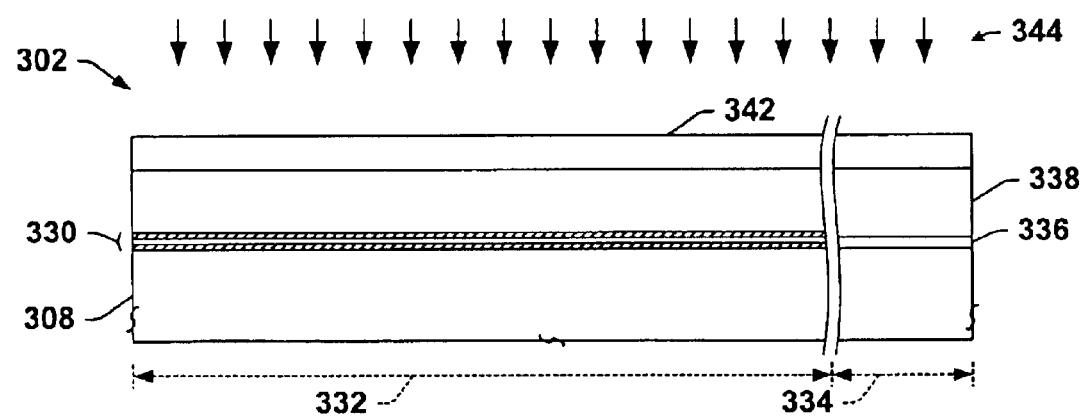
FIG. 7 is a partial side elevation view in section illustrating deposition of a nitride anti-reflective coating layer over the first polysilicon layer in the wafer of FIG. 5.

In FIG. 4, an ONO layer 330 is formed, comprising a lower oxide layer 330a, such as $SiO_2$ formed over core and periphery regions 332 and 334, respectively, of the substrate 308, as well as a nitride layer 330b formed over the lower oxide 330a, and an upper oxide layer 330c formed over the nitride 330b, such as through individual deposition and/or oxidation steps (not shown). In FIG. 5, a periphery portion of the ONO layer 330 is removed in the periphery region 334, and a periphery gate oxide 336 is grown over the exposed substrate 308 in the region 334. In FIG. 6, a first polysilicon layer 338 is formed over the ONO layer 330 and the periphery gate oxide 336 via a grown or deposition process 340, such as CVD or other processes as are known. In FIG. 7, an anti-reflective coating layer 342 is deposited over the first polysilicon layer 338, such as by deposition of $SiN_3$, SiON, $SiN_x$, $SiON_x$, $SiC_x$, or the like, via a deposition process 344.

Figure 8:
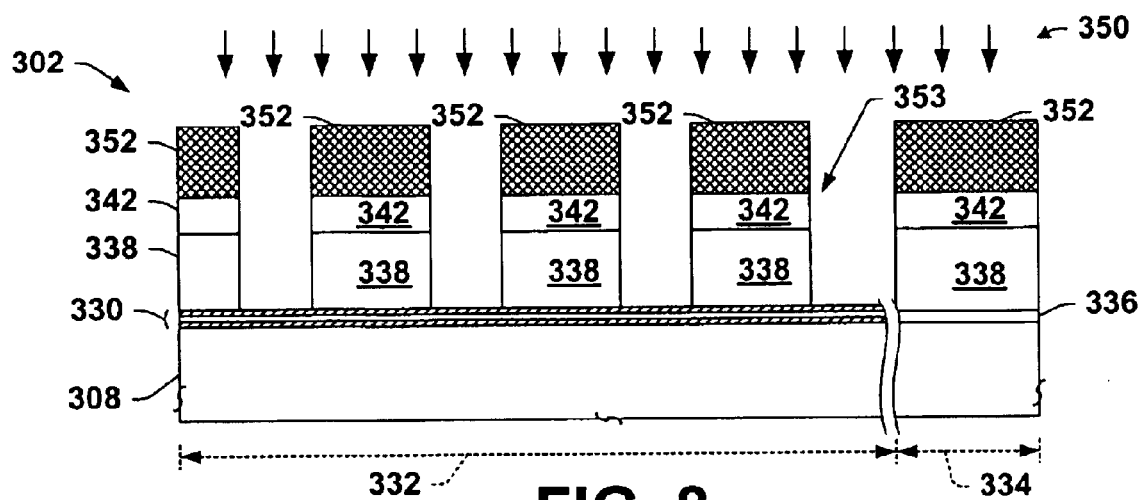
FIG. 8 is a partial side elevation view in section illustrating an etch process to remove portions of the first polysilicon layer and the anti-reflective coating layer in prospective source/drain regions to form polysilicon gate structures in the wafer of FIG. 7.
Figure 9:
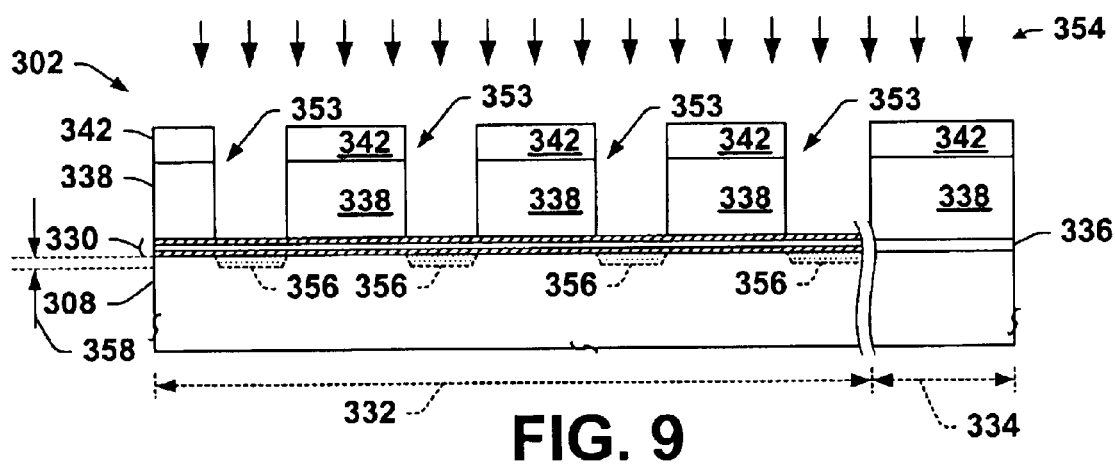
FIG. 9 is a partial side elevation view in section illustrating a first implantation process providing first dopants to the source/drain regions of the substrate using the polysilicon gate structures as an implant mask in the wafer of FIG. 8.
Figure 10:
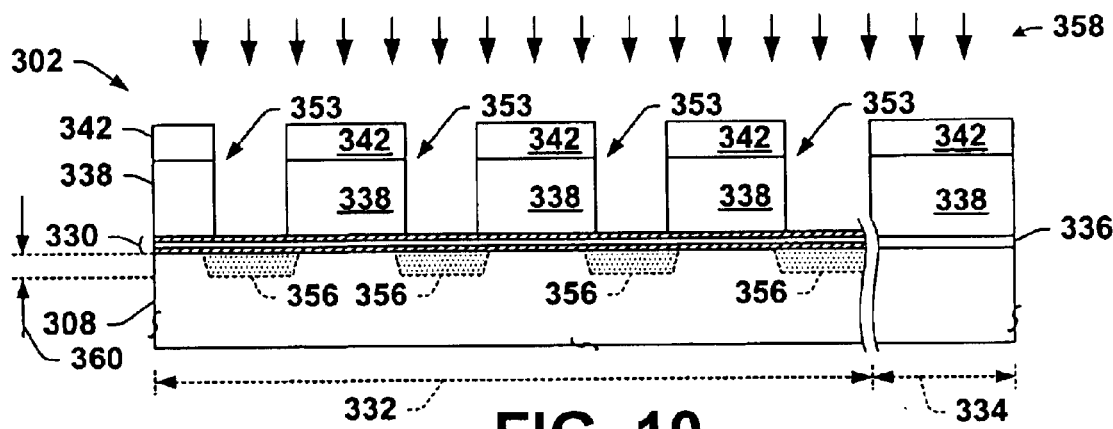
FIG. 10 is a partial side elevation view in section illustrating a thermal heating process to drive implanted dopants downward into the substrate and laterally under the polysilicon gate structures in the wafer of FIG. 9.

In FIG. 8, an etch process 350 is employed with a patterned resist 352 to create polysilicon gate structures 353 over prospective channel regions in the substrate 308 by removing portions of the first polysilicon layer 338 and the anti-reflective coating layer 342 in prospective source/drain regions of the substrate 308 in the memory cell portion 332 while covering the periphery region 334. In FIG. 9, an LDC implant process 354 is employed to provide first dopants 356 to the source/drain regions of the substrate 308 to a first depth 358 using the polysilicon gate structures 353 as an implant mask. A thermal process 358 is employed in FIG. 10 to heat the substrate 308 to drive the first dopants 356 into the substrate 308 to a second depth 360 and to laterally diffuse a portion of the first dopants 356 under the polysilicon gate structures 353.

Figure 11:
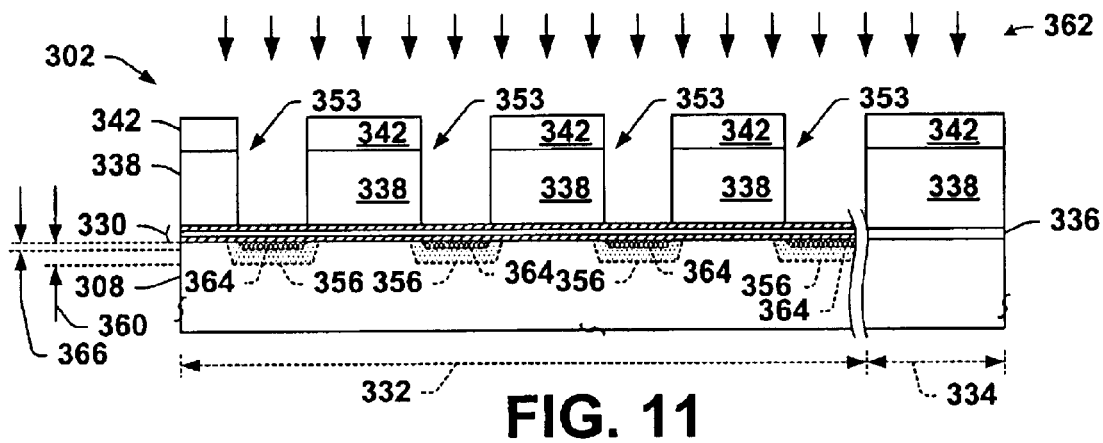
FIG. 11 is a partial side elevation view in section illustrating a second implantation process providing second dopants to the source/drain regions of the substrate using the polysilicon gate structures as an implant mask in the wafer of FIG. 10.

A second implant process 362 is performed in FIG. 11 to provide second dopants 364 to the source/drain regions of the substrate 308 to a third depth 366 using the polysilicon gate structures 353 as an implant mask, wherein the third depth 366 is less than the second depth 360. It is noted in FIGS. 9–11 that the employment of the polysilicon gate structures 353 as an implant mask for the implantation processes 354 and 362 self-aligns the implanted dopants 356 and 364, thereby avoiding misalignment problems associated with prior techniques wherein two different masking operations were used and it allows for thermal diffusion between the two implants for junction profile control. Thus, the invention advantageously facilitates reduction or scaling of the channel lengths of the memory devices in the wafer 302.

Figure 12:
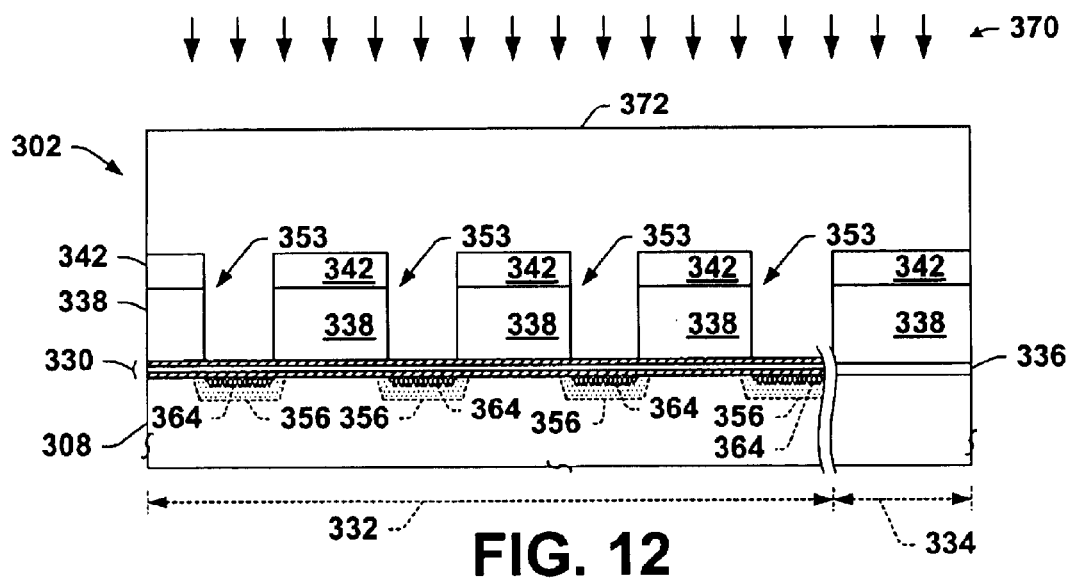
FIG. 12 is a partial side elevation view in section illustrating deposition of a dielectric material over and between the polysilicon gate structures in the wafer of FIG. 11.
Figure 13:
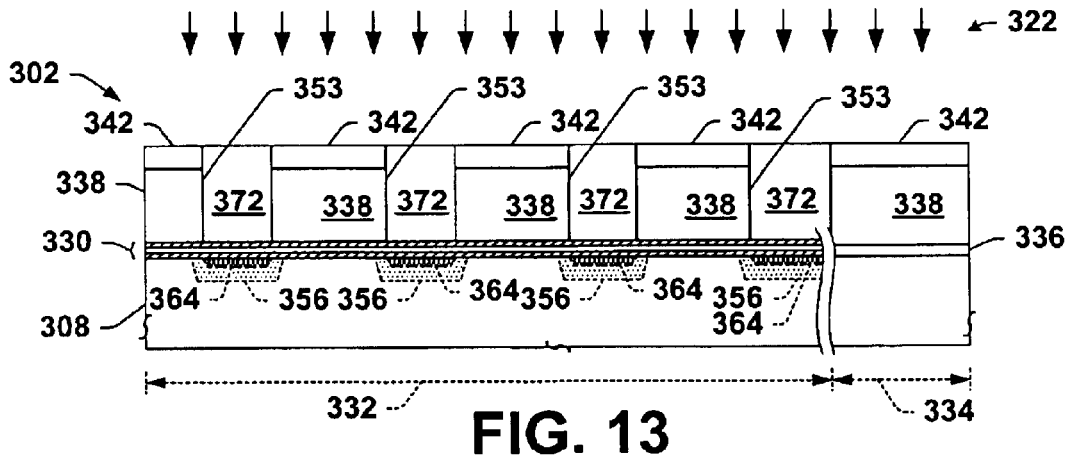
FIG. 13 is a partial side elevation view in section illustrating a planarization process to remove dielectric material over the polysilicon gate structures using the chemical mechanical polishing process of FIG. 3E in the wafer of FIG. 12.
Figure 14:
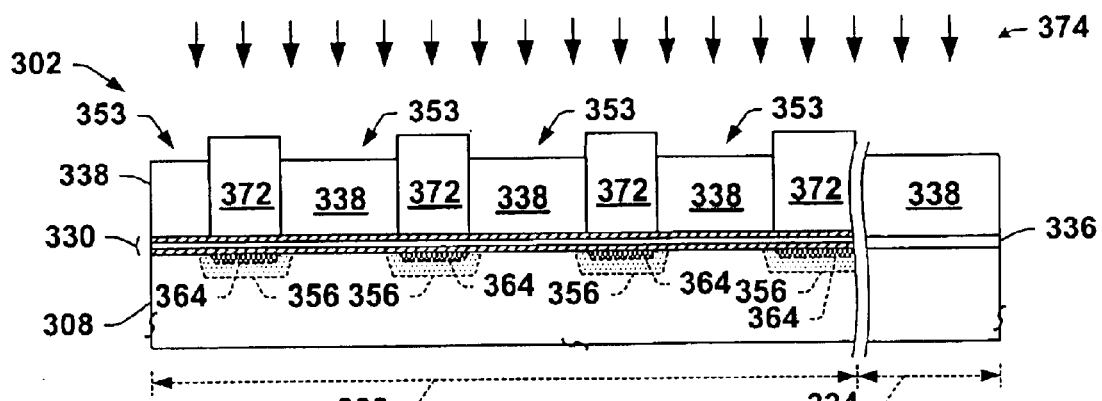
FIG. 14 is a partial side elevation view in section illustrating a process for removing remaining anti-reflective coating material from the wafer of FIG. 13.
Figure 15A:
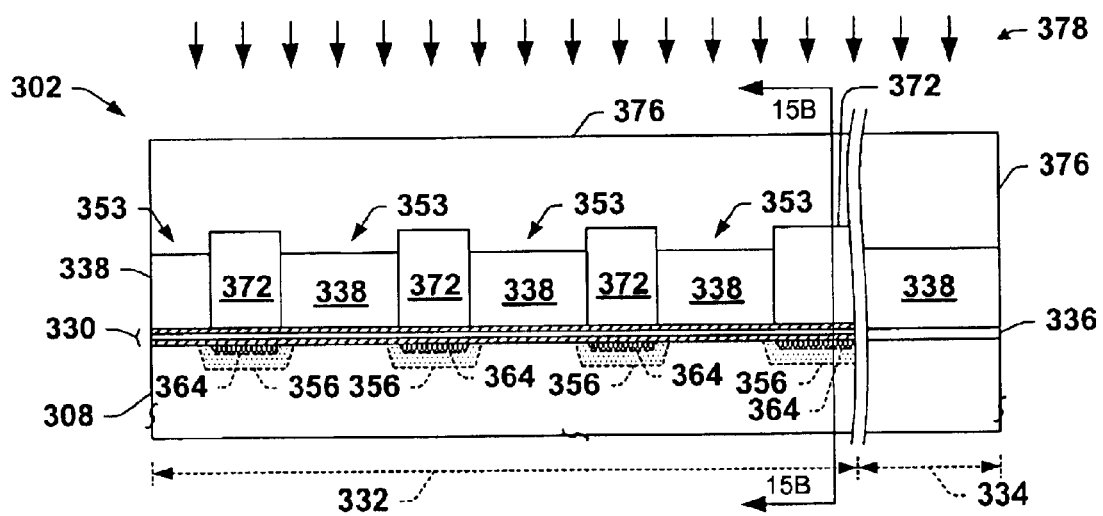
FIG. 15A is a partial side elevation view in section illustrating deposition of a second polysilicon layer over the wafer of FIG. 14.
Figure 15B:
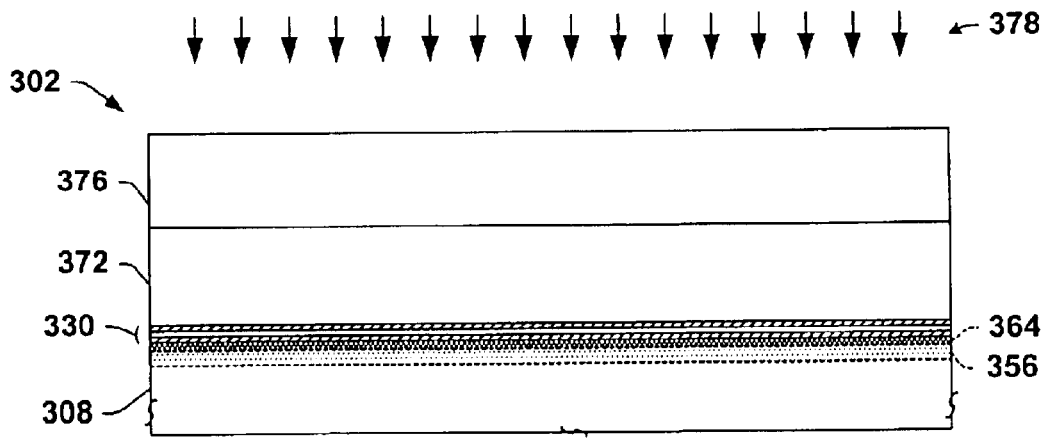
FIG. 15B is a partial end elevation view in section taken along line 15B—15B of FIG. 15A.

In FIG. 12, a deposition process 370 is employed to form a dielectric layer 372, such as $SiO_2$, over the source/drain regions of the wafer 302 and over the polysilicon gate structures 353. It is noted that the structure in FIG. 12 comprises $SiO_2$ dielectric material overlying the nitride anti-reflective coating material 342, which in turn overlies the top of the polysilicon material 338 of the gate structures 353. As this structure comprises similar materials as that of FIG. 3D, the same CMP planarization process 322 is employed in FIG. 13 to planarize the wafer 302, stopping on the anti-reflective coating nitride layer 342. The remaining nitride material 342 is then removed by a stripping process 374 in FIG. 14. As illustrated in FIGS. 15A and 15B, a second polysilicon layer 376 is then deposited using a deposition process 378, wherein the second polysilicon layer 376 may be formed using the same or similar processing steps and materials as used in forming the first polysilicon layer 338 (e.g., process 340 of FIG. 6).

Figure 16A:
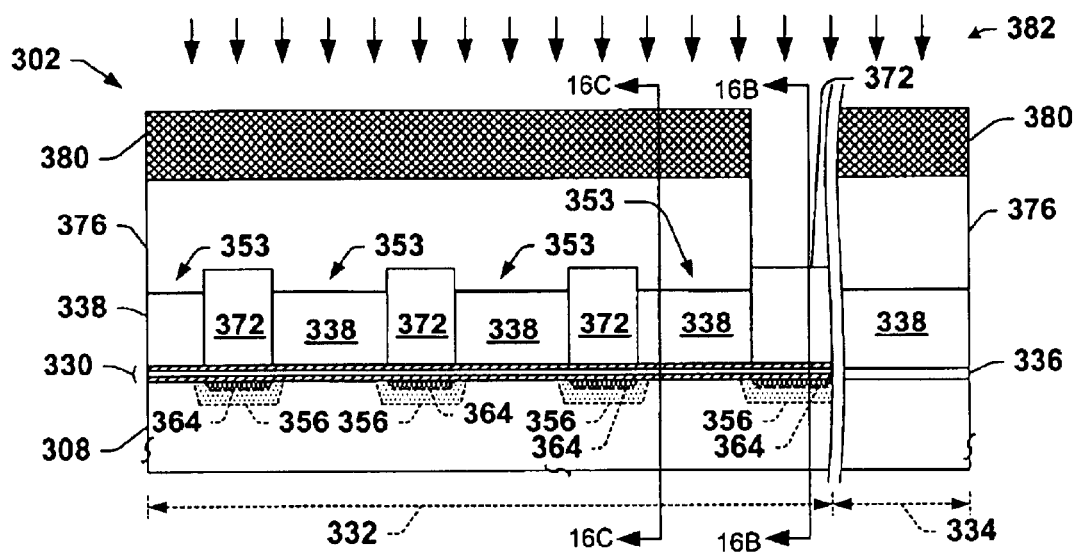
FIG. 16A is a partial side elevation view in section illustrating a masked etch process for removing material from portions of the first and second polysilicon layers to define wordlines in the wafer of FIGS. 15A and 15B.
Figure 16B:
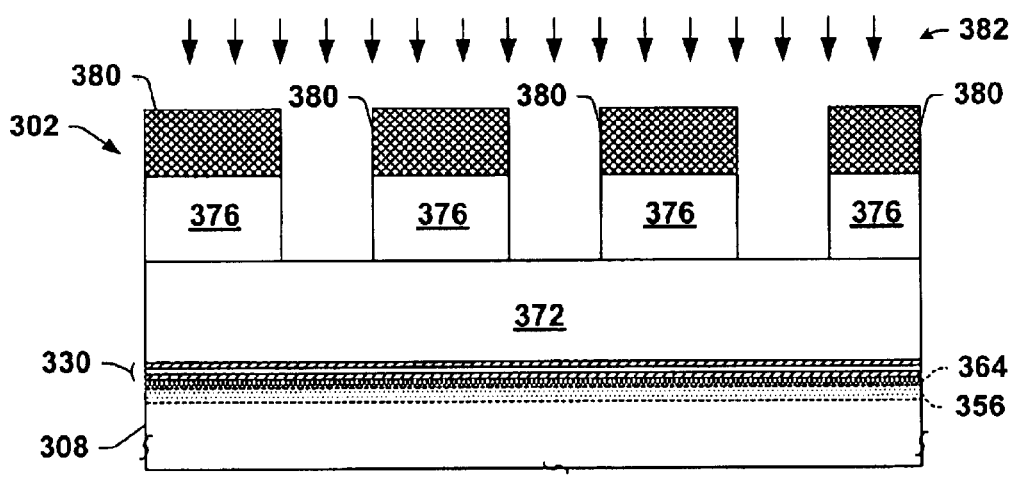
FIG. 16B is a partial end elevation view in section taken along line 16B—16B of FIG. 16A.
Figure 16C:
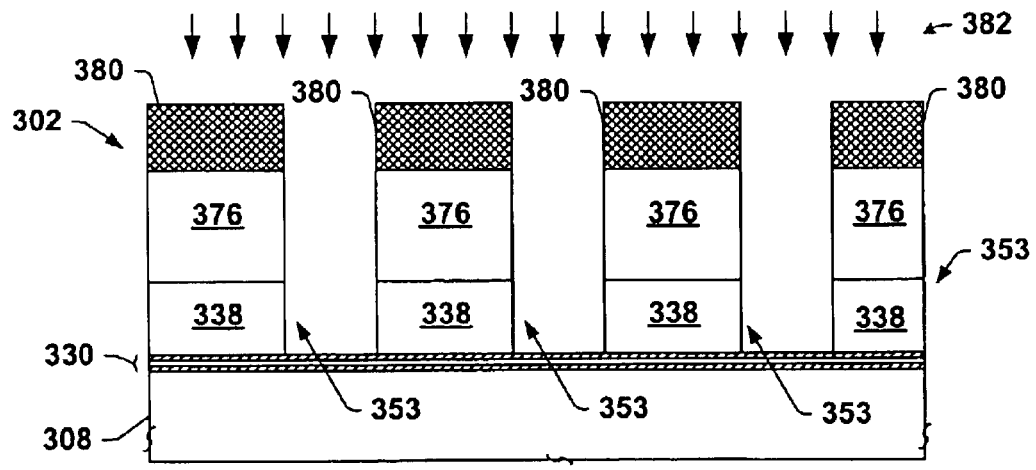
FIG. 16C is a partial end elevation view in section taken along line 16C—16C of FIG. 16A.
Figure 17A:
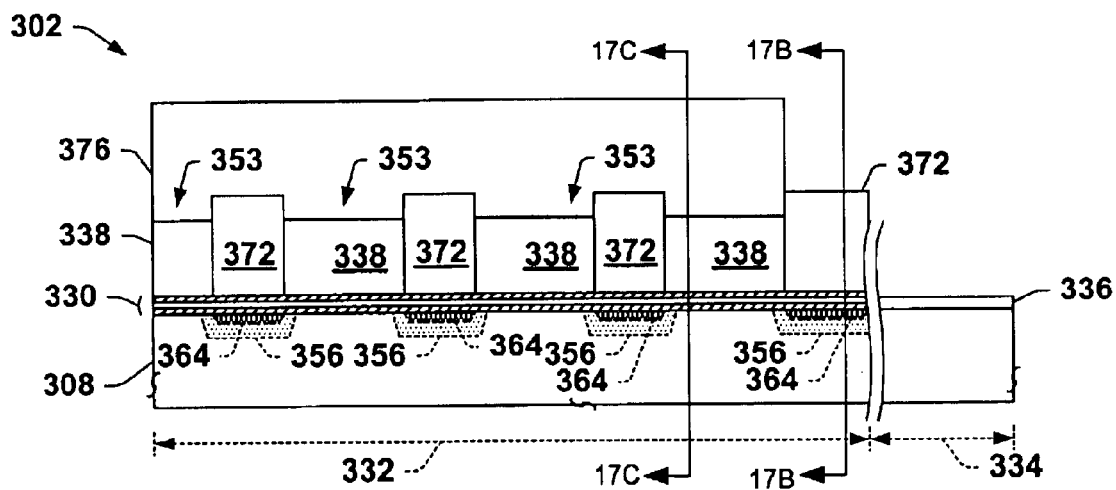
FIG. 17A is a partial side elevation view in section illustrating the wafer of FIGS. 16A–16C following removal of photoresist.
Figure 17B:
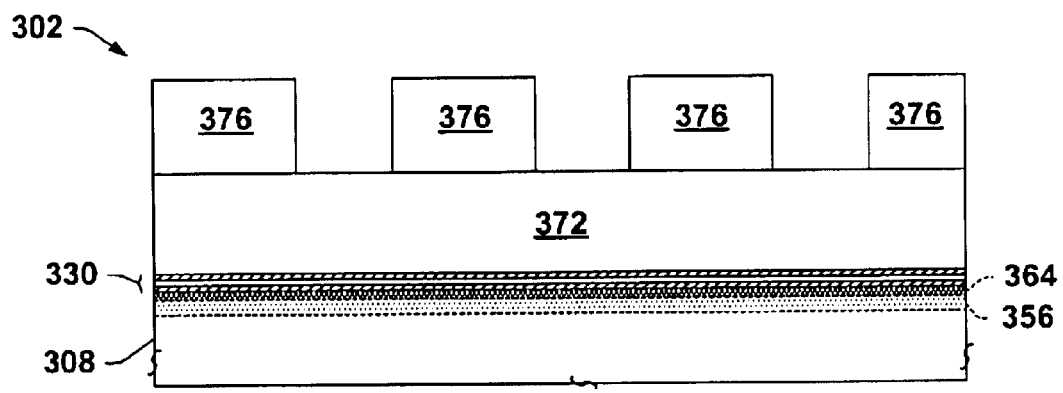
FIG. 17B is a partial end elevation view in section taken along line 17B—17B of FIG. 17A.
Figure 17C:
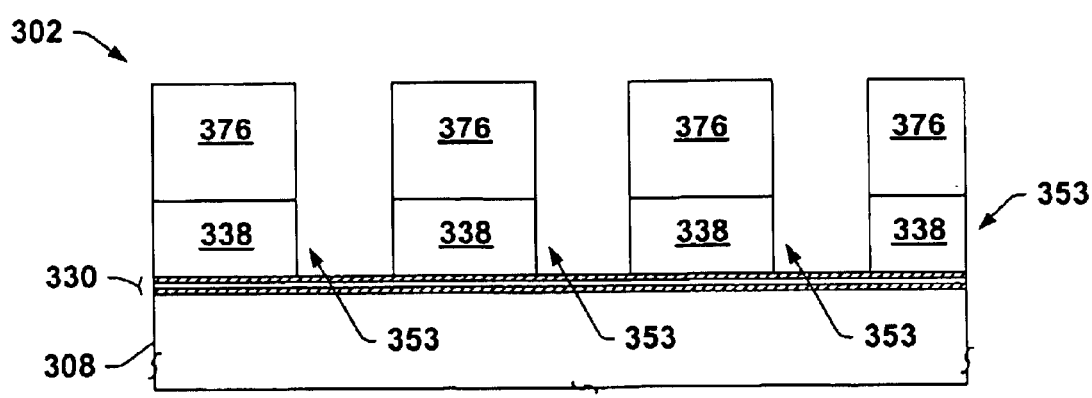
FIG. 17C is a partial end elevation view in section taken along line 17C—17C of FIG. 17A.

In FIGS. 16A–16C, a patterned resist mask 380 is formed over the wafer 302, covering the wordline regions in memory cell portions of the active regions 332 and completely covering the periphery region 334. An etch process 382 is employed to remove the exposed portions of the polysilicon layers 338 and 376, leaving the remaining dielectric material 372 and defining wordline structures in the second polysilicon layer 376. The resist 380 is then removed, leaving the structure illustrated in FIGS. 17A–17C. Thereafter, further processing steps (not shown) are performed to fabricate peripheral devices, such as transistors, in the peripheral region 334 of the wafer 302, and to form metal layers or other interconnect structures, using back end processes as are known. It will be appreciated that alternatively, some processing of the peripheral circuitry in the region 334 may be performed while processing the memory cells in the core region 332. For example, peripheral gate masking an etching may be performed while forming the wordlines in the core region 332 using the second polysilicon layer 376.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of fabricating flash memory cells in a wafer, comprising:

forming and filling isolation trenches in isolation regions of the wafer;

planarizing the wafer to separate individual isolation structures in the isolation regions using a first chemical mechanical polishing process;

forming polysilicon gate structures over a triple layer dielectric-charge trapping-dielectric stack in prospective channel regions of the wafer;

forming dielectric material over prospective source/drain regions of the wafer and over the polysilicon gate structures; and planarizing the wafer to remove dielectric material over the polysilicon gate structures in the prospective channel regions using the first chemical mechanical polishing process.

2. The method of claim 1, further comprising forming the triple layer dielectric-charge trapping-dielectric stack over a substrate before forming the polysilicon gate structures, the triple layer dielectric-charge trapping-dielectric stack comprising a first oxide layer overlying the substrate, a nitride layer overlying the first oxide layer, and a second oxide layer overlying the nitride layer.

3. The method of claim 1, further comprising forming polysilicon wordline structures individually connecting polysilicon gate structures along a wordline after planarizing the wafer to remove dielectric material over the polysilicon gate structures in the prospective channel regions.

4. The method of claim 1, further comprising forming a nitride layer over the polysilicon gate structures before forming the dielectric material, wherein planarizing the wafer to remove dielectric material over the polysilicon gate structures in the prospective channel regions comprises removing the dielectric material using the first chemical mechanical polishing process and stopping on the nitride layer formed over the polysilicon gate structures.

5. The method of claim 1, further comprising implanting the prospective source/drain regions of the wafer after forming the polysilicon gate structures.

6. The method of claim 5, further comprising forming polysilicon wordline structures individually connecting polysilicon gate structures along a wordline after planarizing the wafer to remove dielectric material over the polysilicon gate structures in the prospective channel regions.

7. The method of claim 5, further comprising forming a nitride layer over the polysilicon gate structures before forming the dielectric material, wherein planarizing the wafer to remove dielectric material over the polysilicon gate structures in the prospective channel regions comprises removing the dielectric material using the first chemical mechanical polishing process and stopping on the nitride layer formed over the polysilicon gate structures.

8. A method of fabricating flash memory cells in a wafer, comprising:

forming polysilicon gate structures over a triple layer dielectric-charge trapping-dielectric stack overlying prospective channel regions of the a substrate;

implanting source/drain regions of the wafer with impurities using the polysilicon gate structures as an implant mask; and forming polysilicon wordline structures individually connecting polysilicon gate structures along a wordline.

9. The method of claim 8, wherein implanting the source/drain regions comprises:

performing a first implant to provide first dopants to the source/drain regions of the substrate to a first depth using the polysilicon gate structures as an implant mask;

heating the substrate to drive the first dopants into the substrate to a second depth and to laterally diffuse a portion of the first dopants under the polysilicon gate structures; and performing a second implant to provide second dopants to the source/drain regions of the substrate to a third depth using the polysilicon gate structures as an implant mask, the third depth being less than the second depth.

10. The method of claim 9, further comprising:

forming the triple layer dielectric-charge trapping-dielectric stack over the substrate before forming the polysilicon gate structures; and forming polysilicon wordline structures individually connecting polysilicon gate structures along a wordline after implanting the source/drain regions.

11. The method of claim 10, wherein forming the triple layer dielectric-charge trapping-dielectric stack comprises:

forming a first oxide layer over the substrate;

forming a nitride layer over the first oxide layer; and forming a second oxide layer over the nitride layer before forming the polysilicon gate structures.

12. The method of claim 11, wherein forming the polysilicon gate structures comprises:

depositing a first polysilicon layer over the triple layer dielectric-charge trapping-dielectric stack;

depositing an anti-reflective coating over the first polysilicon layer; and removing portions of the first polysilicon layer and the anti-reflective coating layer in the source/drain regions.

13. The method of claim 8, wherein forming the polysilicon gate structures comprises:

depositing a first polysilicon layer over the triple layer dielectric-charge trapping-dielectric stack;

depositing an anti-reflective coating over the first polysilicon layer; and removing portions of the first polysilicon layer and the anti-reflective coating layer in the source/drain regions.

14. The method of claim 13, further comprising:

forming isolation trenches in isolation regions of the wafer;

depositing isolating material over the wafer to fill the isolation trenches;

planarizing the wafer to separate individual isolation structures in the isolation trenches using a first chemical mechanical polishing process before forming the polysilicon gate structures;

forming dielectric material over prospective source/drain regions of the wafer and over the polysilicon gate structures after removing portions of the first polysilicon layer and the anti-reflective coating layer in the source/drain regions; and planarizing the wafer to remove dielectric material over the polysilicon gate structures in the prospective channel regions using the first chemical mechanical polishing process.

15. The method of claim 13, wherein implanting the source/drain regions comprises:

performing a first implant to provide first dopants to the source/drain regions of the substrate to a first depth using the polysilicon gate structures as an implant mask;

heating the substrate to drive the first dopants into the substrate to a second depth and to laterally diffuse a portion of the first dopants under the polysilicon gate structures; and performing a second implant to provide second dopants to the source/drain regions of the substrate to a third depth using the polysilicon gate structures as an implant mask, the third depth being less than the second depth.

16. A method of fabricating dual bit SONOS flash memory cells, comprising:

forming polysilicon gate structures over a triple layer dielectric-charge trapping-dielectric stack overlying prospective channel regions of the a substrate; and providing impurities to source/drain regions of the substrate after forming the polysilicon gate structures.

17. The method of claim 16, wherein forming the polysilicon gate structures comprises:

depositing a first polysilicon layer over the triple layer dielectric-charge trapping-dielectric stack;

depositing an anti-reflective coating over the first polysilicon layer; and removing portions of the first polysilicon layer and the anti-reflective coating layer in the source/drain regions.

18. The method of claim 17, wherein providing impurities to the source/drain regions comprises:

implanting first dopants to the source/drain regions of the substrate to a first depth using the polysilicon gate structures as an implant mask;

driving the first dopants to a second depth in the substrate; and implanting second dopants to the source/drain regions to a third depth using the polysilicon gate structures as an implant mask.

19. The method of claim 18, further comprising:

forming isolation trenches in isolation regions of the wafer;

depositing isolating material over the wafer to fill the isolation trenches;

planarizing the wafer to separate individual isolation structures in the isolation trenches using a first chemical mechanical polishing process before forming the polysilicon gate structures;

forming dielectric material over prospective source/drain regions of the wafer and over the polysilicon gate structures after removing portions of the first polysilicon layer and the anti-reflective coating layer in the source/drain regions; and planarizing the wafer to remove dielectric material over the polysilicon gate structures in the prospective channel regions using the first chemical mechanical polishing process.

20. The method of claim 17, wherein providing impurities to the source/drain regions comprises:

implanting first dopants to the source/drain regions of the substrate to a first depth using the polysilicon gate structures as an implant mask;

driving the first dopants to a second depth in the substrate; and implanting second dopants to the source/drain regions to a third depth using the polysilicon gate structures as an implant mask.

21. The method of claim 17, wherein the triple layer dielectric-charge trapping-dielectric stack comprises an ONO layer.

22. The method of claim 16, wherein the triple layer dielectric-charge trapping-dielectric stack comprises an ONO layer.

* * * * *